United States Patent
Dixon

(10) Patent No.: US 9,111,830 B1
(45) Date of Patent: Aug. 18, 2015

(54) PERFORATED BLOCKING LAYER FOR ENHANCED BROAD BAND RESPONSE IN A FOCAL PLANE ARRAY

(71) Applicant: SENSORS UNLIMITED, INC., Princeton, NJ (US)

(72) Inventor: Peter E. Dixon, Princeton, NJ (US)

(73) Assignee: SENSORS UNLIMITED, INC., Princeton, NJ (US)

( * ) Notice: Subject to any disclaimer, the term of this patent is extended or adjusted under 35 U.S.C. 154(b) by 136 days.

(21) Appl. No.: 13/986,660

(22) Filed: May 22, 2013

(51) Int. Cl.
  *G01J 5/20* (2006.01)
  *H01L 27/146* (2006.01)
  *H01L 31/18* (2006.01)

(52) U.S. Cl.
  CPC ...... *H01L 27/14625* (2013.01); *H01L 31/1876* (2013.01)

(58) Field of Classification Search
  CPC ................................ H01L 31/042; G01J 1/02
  USPC ................................ 250/338.4, 332, 339.02
  See application file for complete search history.

(56) References Cited

U.S. PATENT DOCUMENTS

| | | | | |
|---|---|---|---|---|
| 5,876,880 | A | * 3/1999 | Vonach et al. | 430/5 |
| 5,973,316 | A | * 10/1999 | Ebbesen et al. | 250/216 |
| 8,299,497 | B1 | * 10/2012 | Klem et al. | 257/184 |

* cited by examiner

*Primary Examiner* — David Porta
*Assistant Examiner* — Meenakshi Sahu
(74) *Attorney, Agent, or Firm* — Cantor Colburn LLP

(57) ABSTRACT

Provided is a focal plane array that includes an array of photodetectors, with each photodetector being in electrical communication with a corresponding one of an electrode of a read out integrated circuit. The array of photodetectors include an insulating layer, a blocking layer comprising at least one blind via, and an active layer formed between the insulating layer and the blocking layer. A first portion of the blocking layer transmits radiation having a first wavelength and reflects radiation having second wavelength that is lower than that of the first wavelength. A diameter of the at least one blind via is selected to allow radiation of the second wavelength to pass through the at least one blind via.

20 Claims, 12 Drawing Sheets

PERFORATED BLOCKING LAYER FOR ENHANCED BROAD BAND RESPONSE IN A FOCAL PLANE ARRAY

FIELD OF THE INVENTION

This invention relates generally to the field of photodetectors, particularly near-infrared (NIR) and short-wave infrared (SWIR) photodetectors, and specifically to the field of focal plane arrays comprising a plurality of photodetectors.

BACKGROUND OF THE INVENTION

The visible spectrum of light extends from wavelengths of about 0.4 microns to about 0.7 microns. Wavelengths longer than visible wavelengths can be detected by dedicated sensors. However, SWIR light is reflective light which bounces off of objects much like visible light. As a result of its reflective nature, detected SWIR light can have shadows and contrast in its imagery. For low light level imaging applications, noise/leakage current such as dark current must be reduced to obtain sufficient sensitivity.

Sensors constructed from materials like mercury cadmium telluride (HgCdTe) or indium antimonide (InSb) can be very sensitive in the SWIR to MWIR band. However, at least in the case of HgCdTe, because of high dark current due to the narrow bandgap, these devices must be mechanically cooled, often to cryogenic temperatures, which increases power consumption, size and cost of cameras that utilize such sensors. Newer processes are making it possible to achieve SWIR to MWIR (1.1 µm-3.5 vm) imaging at higher operating temperatures, but SWaP (Size, Weight and Power) remain a challenge, as well, MWIR systems cannot image visible energy, such that systems requiring visible signal response (typically Blue 450 nm to red 700 nm) must also employ EO sensors for visible imaging and then merge the two datastreams with fusion algorithms or provide dual displays for managing the two separate bands.

Thermal imagers are another class of camera with good detection abilities. While thermal imaging can detect the presence of a warm object against a cool background, they provide low resolution and dynamic range across spectral content requiring sensing of reflected light, such as seeing objects like building, furniture, or other materials which are of minimal thermal deviation from the background scene. Additionally, due to the material properties of many glasses, particularly those utilized in industrial environments, LWIR (thermal spectrum typically 8 um to 12 um) is not transmitted, but is absorbed or reflected in the medium, thus thermal sensing alone is not capable of imaging through common window materials such as in buildings or ANSI Standard protective shielding in industrial assembly lines requiring such measures Additionally, CMOS and CCD imagers are excellent devices that continue to evolve to meet military needs. But such sensors are typically utilized for visible light response, having near Infrared Response in the short-end of the IR spectrum (typically cutting off at no more than 1100 nm. In order to image well for night vision applications, based imagers require substantial amplification, which create image quality challenges due to noise amplification. Else, Silicon-based imagers are indirect bandgap, and while capable of being manufactured at low cost, with high resolution, suffer relative low sensitivity to NIR energy as compares to III-V direct bandgap materials with narrow absorption band to achieve higher sensitivity across the full SWIR band, such as Indium Gallium Arsenide.

InGaAs sensors can be made extremely sensitive ($D^* \sim 1E+14$ Jones in commercial InGaAs imagers), literally counting individual photons. Thus, when built as focal plane arrays with thousands or millions of tiny point sensors, or photodiode sensor pixels, SWIR cameras will work in very dark conditions. Images from an InGaAs camera can be comparable to visible images in resolution and detail; however, SWIR images are not in color. This makes objects easily recognizable and yields one of the tactical advantages of the SWIR, namely, object or individual identification.

For conventional back-illuminated photodetectors, such as those which are used in hybrid IR Focal Plane Arrays structures, a back-illuminated imaging plane includes a substrate material of a higher bandgap than that of the active material. InGaAs for SWIR photodetection is traditionally grown on Indium Phosphide (InP) substrates, and is capable of photoresponse in both visible to SWIR bands (450 nm to 1700 mn). The InP (1.35 eV) substrate is of higher bandgap than the lattice-matched InGaAs (0.7 eV), this will limit useful application for InGaAs imagers to 1100 nm→1700 nm photoresponse unless the InP substrate is removed. The substrate, therefore, acts as a long-pass filter for all energy above that of its band gap. Wavelength is inversely proportional to energy ($E=hc/\lambda$, where: E is energy, h is planck's constant, c is speed of light, 1 is wavelength), thus longer wavelength passes above the absorption 'cutoff' of a given material. It is desirable, however, to extend the photo response of traditional compound semiconductor imaging in SWIR to include shorter (visible) wavelengths, especially for applications where a short-wave IR solution may displace those imaging devices having a true visible response incorporated therein.

In an approach to achieve visible response in a conventional InGaAs/InP based imaging systems, for example, the substrate is removed using mechanical polishing methods or the use of etch stop layers. However, because the substrate in such systems is commonly used as the cathode of the diode array (Substrate Contact), the substrate cannot be completely removed. Such solutions are presently offered as commercially, and for specialty applications.

In some material systems, as indicated in the above discussion, the substrate or buffer layer is of higher bandgap than that of the lower bandgap semiconductor active layer. In such systems, the lower bandgap semiconductors suffer high recombination velocity if p-n junctions are exposed at the surface, due to defects, surface states, and what is commonly referred to as carrier trapping. The defect states reduce the bandgap by providing reduced energy potential for conduction. Thus the absence of a high bandgap buffer layer (also known as cladding layer) degrades device performance. That is, the absence of an energy band offset in a region with low electric field does not allow efficient migration of photo-generated carriers (minority carriers). Accordingly, in the absence of a cladding layer, the quantum-efficiency suffers, due to minority carrier trapping.

Thus, conventional devices have relied upon a careful balance of thickness of remaining substrate "blocking layer" (buffer/cladding layer) to achieve desirable electrical properties such as limiting surface recombination, while also providing for adequate transmission of light to the active layer. One approach to minimize surface recombination in higher bandgap materials has been with N+ doping of cladding layers to assist in minority carrier migration. In such an approach, as the Fermi-level is moved closer to the conduction band in this layer, the result is carrier migration away from the surface and towards the junction. This explains the quantum mechanical dependency upon the outermost (exposed) layers of a semiconductor structure. While not limited to a particular theory, this applies equally to etched sidewalls as for the "front and back" surface of the wafer. Accordingly, it has become increasingly desirable to leave a sufficiently thick layer to maintain robust control over the electrical performance thereof and the quantum efficiency of the device. However, the optical absorption of the substrate layer requires that it be made substantially thin so as to allow transmission of visible wavelength light to the active layer. For example, a typical thickness of the blocking layer to achieve adequate visible response in SWIR imagers less than 1.5 µm. However, such thicknesses are vulnerable to etch-pits and various defects. To achieve robust electrical and mechanical performance, it is desirable to leave this layer as thick possible without cutting off photo response for the desired application.

One drawback of a conventional focal plane array, as shown in FIGS. 1A-1B in electrical communication with a read out integrated circuit 9, is with respect to the optical properties thereof. For example, as shown, the photodetector array includes a continuous backing layer 11 that transmits only radiation 22 having a first wavelength, such as infrared (IR) radiation, while completely blocking radiation 20 having a second wavelength, such as visible (vis) radiation. It would be desirable to have a focal plane array that overcomes these optical issues.

It is also important to note that some material systems do not have appropriate etch-stop layers for executing such a process as described above. For example, during fabrication of a conventional InGaAs sensor, selective etch stop layers are grown in order to allow for bulk substrate removal, such as InP substrate removal. As such, processes employed for those materials without chemical means of stopping substrate removal must utilize CMP or mechanical lathe or diamond turn operations. The thickness control of such methods is very good, however achieving <2 um thickness of remaining 'blocking layer' is not practical. The ability to leave the 'blocking layer' thicker would enhance the manufacturability of such structures.

SUMMARY

In an embodiment, there is a focal plane array that includes an array of photodetectors, with each photodetector in electrical communication with a corresponding one of an electrode of a read out integrated circuit. The array of photodetectors can include an insulating layer, a blocking layer comprising at least one blind via, and an active layer formed between the insulating layer and the blocking layer. A first portion of the blocking layer transmits radiation having a first wavelength and reflects radiation having second wavelength that is lower than that of the first wavelength. A diameter of the at least one blind via is selected to allow radiation of the second wavelength to pass through the at least one blind via.

In another embodiment there is a photodetector. The photodetector can include an insulating layer, a blocking layer that includes at least one blind via, an active layer formed between the insulating layer and the blocking layer. A first portion of the blocking layer can transmit radiation having a first wavelength and can reflect radiation having second wavelength that is lower than that of the first wavelength. A diameter of the at least one blind via can be selected to allow radiation of the second wavelength to pass through the at least one blind via.

In yet another embodiment, there is a method of a method of forming a focal plane array. The method can include forming an array of photodetectors. The array of photodetectors can include an insulating layer, a blocking layer that includes a first portion that transmits radiation having a first wavelength and reflects radiation having second wavelength that is lower than that of the first wavelength, and an active layer formed between the insulating layer and the blocking layer. The method can include electrically bonding the array of photodetectors to a read out integrated circuit. Each of the photodetectors can be placed in electrical communication with a corresponding one of an electrode of the read out integrated circuit. The method can also include forming at least one blind via in the blocking layer of the array of photodetectors. A diameter of the at least one blind via can be selected to allow radiation of the second wavelength to pass through the at least one blind via.

Advantages of at least one embodiment include enhanced visible response for SWIR imaging products. An advantage of at least one embodiment includes enhanced visible response over merely thinning the blocking layer by adding blind vias thereto.

Additional advantages of the embodiments will be set forth in part in the description which follows, and in part will be understood from the description, or may be learned by practice of the invention. The advantages will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

DESCRIPTION OF THE EMBODIMENTS

As used herein, the term "blocking layer" can refer to a surface layer, such as a back surface layer, of a photodiode which is incident to a radiation directed to the photodiode. Embodiments described herein include photodetector arrays that have been processed with a patterned etch of the substrate or remaining buffer (blocking) layer, which is the primary layer in the optical path of the incoming photon flux. Reference will now be made in detail to the present embodiments, examples of which are illustrated in the accompanying drawings. Wherever possible, the same reference numbers will be used throughout the drawings to refer to the same or like parts.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5. In certain cases, the numerical values as stated for the parameter can take on negative values. In this case, the example value of range stated as "less that 10" can assume negative values, e.g. −1, −2, −3, −10, −20, −30, etc.

The following embodiments are described for illustrative purposes only with reference to the Figures. Those of skill in the art will appreciate that the following description is exemplary in nature, and that various modifications to the parameters set forth herein could be made without departing from the scope of the present invention. It is intended that the specification and examples be considered as examples only. The various embodiments are not necessarily mutually exclusive, as some embodiments can be combined with one or more other embodiments to form new embodiments.

Figure 1A:
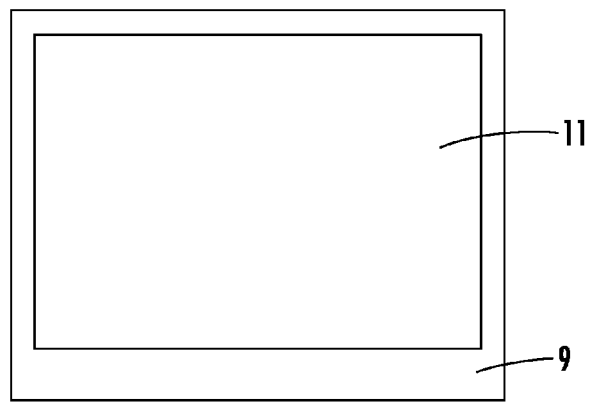
FIG. 1A illustrates a top view of a focal plane array.
Figure 1B:
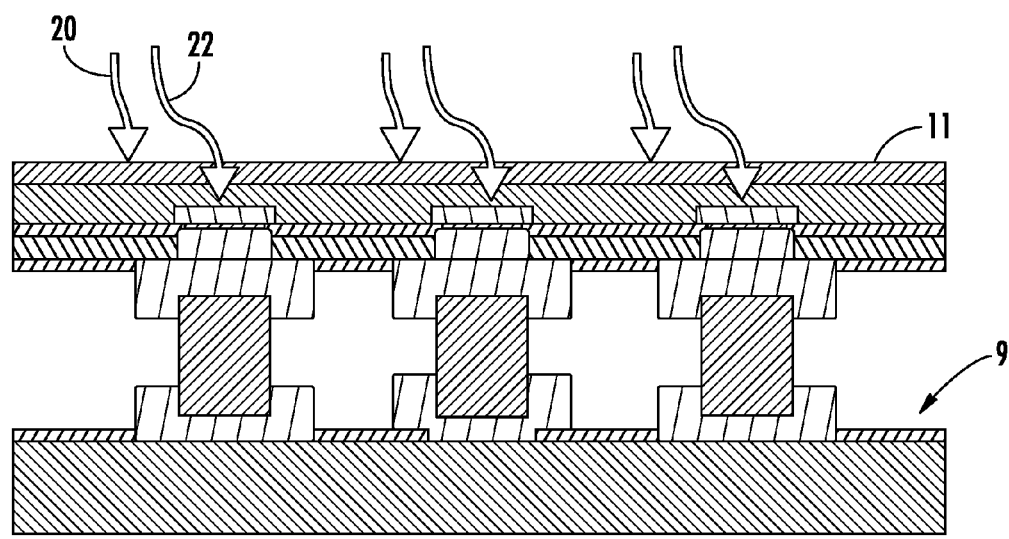
FIG. 1B illustrates a cross-section of the focal plane array of FIG. 1A.
Figure 2A:
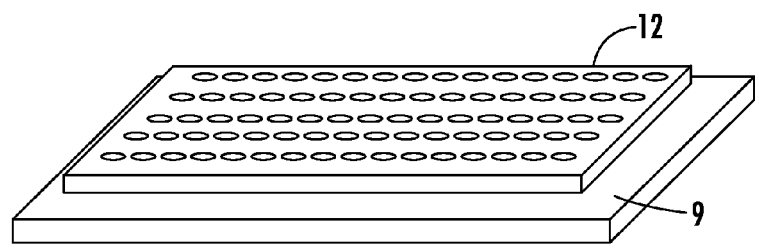
FIG. 2A illustrates a perspective view of a focal plane array of an embodiment.
Figure 2B:
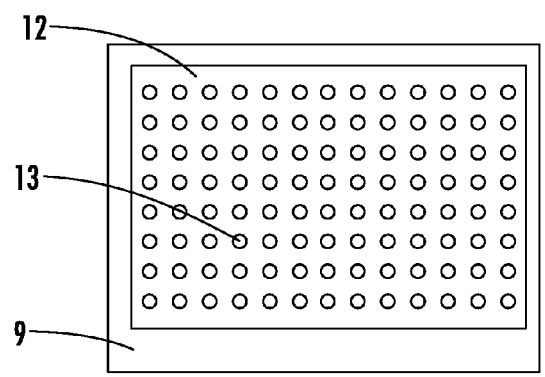
FIG. 2B illustrates a top view of the detector of FIG. 2A.
Figure 2C:
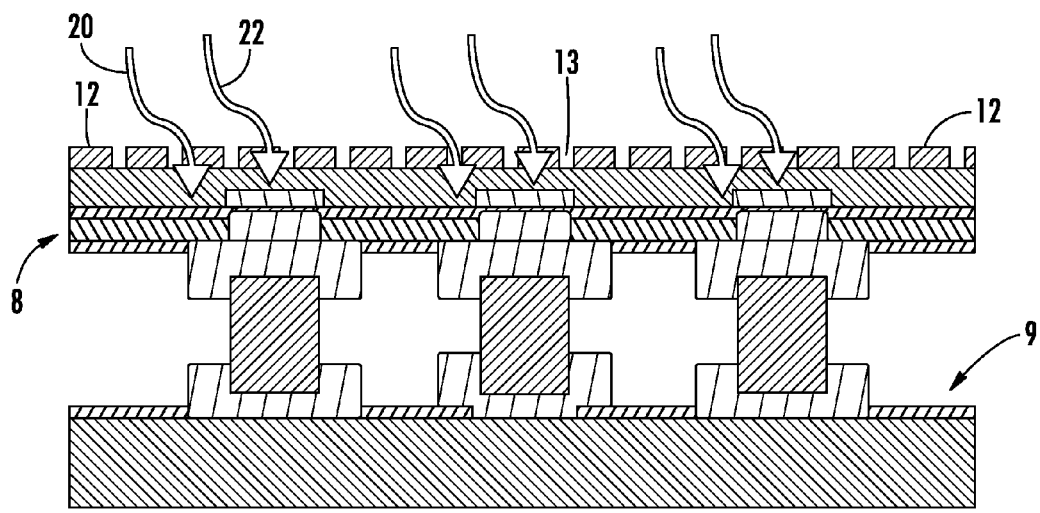
FIG. 2C illustrates a cross section of the detector of FIG. 2A.

Embodiments described herein, such as the focal plane array, as shown in FIGS. 2A-2C, provide a focal plane array that includes an array of photodetectors, such as an array of pixel photodiode photodetectors 8 formed on a perforated backing layer 12, in electrical communication with a read out integrated circuit 9. The perforated backing layers comprise a backing layer that has been modified with at least one blind via, such as an array of blind vias 13 (i.e., holes in the 'blocking layer'). The perforated backing layer can be formed thin enough to transmit radiation having a first wavelength 22, such as IR radiation, through the backing layer itself. The blind vias 13 can each be formed of sufficient diameter to allow transmission of radiation having a second wavelength 20 that is lower than that of the first radiation 22, such as visible light, through the blind vias, yet can be made small enough to not disturb the electric field from the N+ surrounding material. As a result, the quantum efficiency of a device may not suffer surface trapping, due to the field applied, and the photon-transmission can be enhanced due to the absence of the blocking layer.

As shown in FIG. 3A-3D, each of the photodiode photodetectors comprising a single pixel can be formed from a wafer 1. The wafer can include an insulating/dielectric layer 4, such as a plurality of insulating/dielectric layers, a substrate/backing layer 3 and an active layer 2 formed between the insulating layer and the blocking layer.

The wafer can be formed of a compound semiconductor, such as by using a substrate crystal and growing additional layers using organometallic vapor phase epitaxy (OMVPE), also known as metalorganic chemical vapor deposition (MOCVD). In an embodiment, a photodetector can utilize an InGaAsP material system, but is not so limited. As such, the substrate can be an Indium Phosphide (InP) substrate, and epitaxial layers of various compositions utilizing the binary, InP, ternary InGaAs, InAsP, or quaternary InGaAsP materials can be grown over the substrate to form at least one active layer 2. In other embodiments, imaging devices can include photodetectors formed by growing similar backing layer structures utilizing substrates made from GaSb, InAs, InSb, GaAs. Suitable epitaxial layers for such substrates are known in the art by MOCVD crystal-growers or other engineers skilled in epitaxial growth or compound semiconductor device design and fabrication. The material system for a given substrate can be determined by designing the composition of organometallic compounds such that the lattice constant is suitable to achieve the desired electro-optical performance.

For IR imaging applications, typical electrical specification for these materials is such that the substrate is N+, sulfur doped InP, and the added active, buffer and cladding layers are either not intentionally doped (NID) or lightly N-type (N−) or heavily N-type (N+) Typical N-type doping in MOCVD epitaxial growth is achieved by using Silicon to provide an extra electron to the group III element on the lattice. Thus the compound semiconductor, formed using III-V materials Indium and Phosphorous, can thus be 'doped' to have a negative charge. Active (photoresponsive) layer 2 can have a thickness of about 2 µm to about 14 µm. In some embodiments, there can be included additional backing/cladding layers to provide a transition from lower bandgap active layers to higher bandgap. Thus the epitaxial structure grown onto the substrate may be as thin as 3-5 µm, or as thick as tens of microns for complex structures, which may or may not include etch stop layers.

In an embodiment, the raw wafer 1 can be insulated by performing a "passivation" step, which results in the deposition of an insulating/dielectric layer 4 onto the surface of the bare wafer. The insulating layer can prevent material degradation and limit surface states due to oxidation, chemical etch, exposure, or contamination. The insulating/dielectric layer 4 can comprise at least one homogenous film of silicon nitride (SiNx), silicon oxide (SiOx), alumina, ALD, or native oxides. The insulating layer 4 can be formed by plasma deposition such as PECVD, thermal processes such as wet oxidation, evaporative techniques such as electron beam deposition, or electrochemical processes such as anodic oxidation. The step of forming the insulating layer 4 can be referred to as dielectric passivation, or surface passivation. The dielectric passivation is purposed to provide electrical isolation from surface metals, and provide a hard mask for subsequent processes such as etching, diffusion or ion implantation.

Photodiode Formation

Figure 3A:
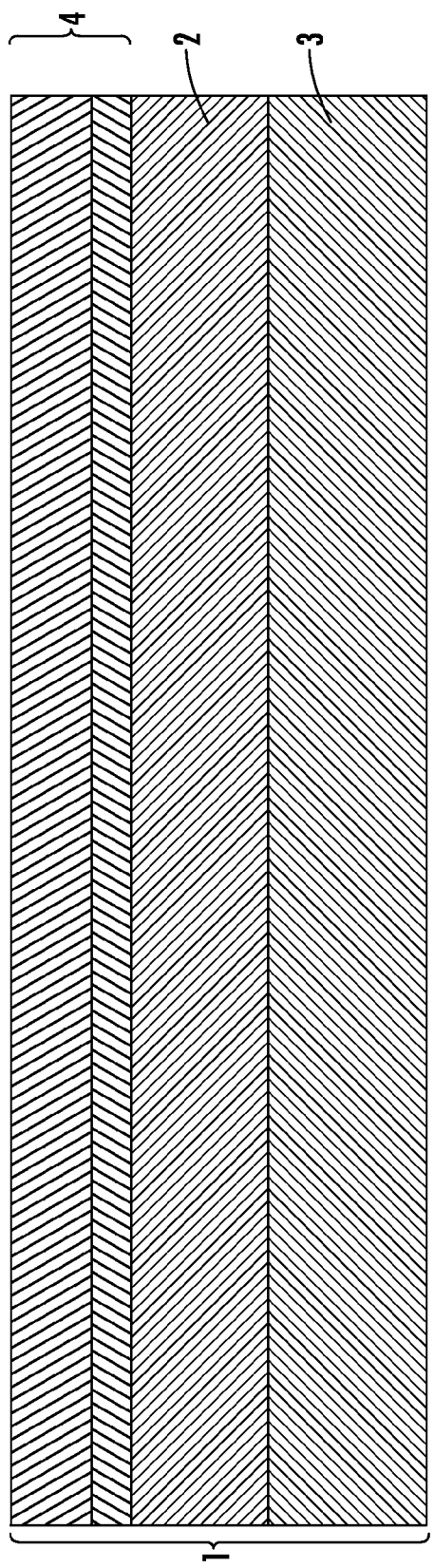
FIGS. 3A-3D illustrate stages of manufacture in a process of making photodetector according to an embodiment.
Figure 3B:
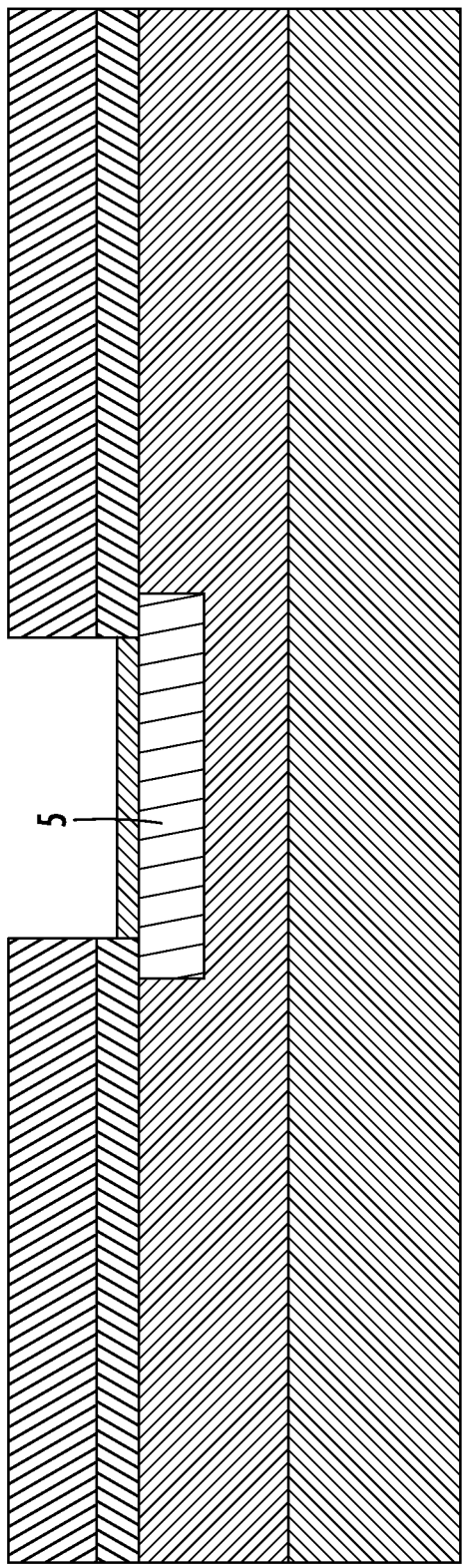
Figure 3C:
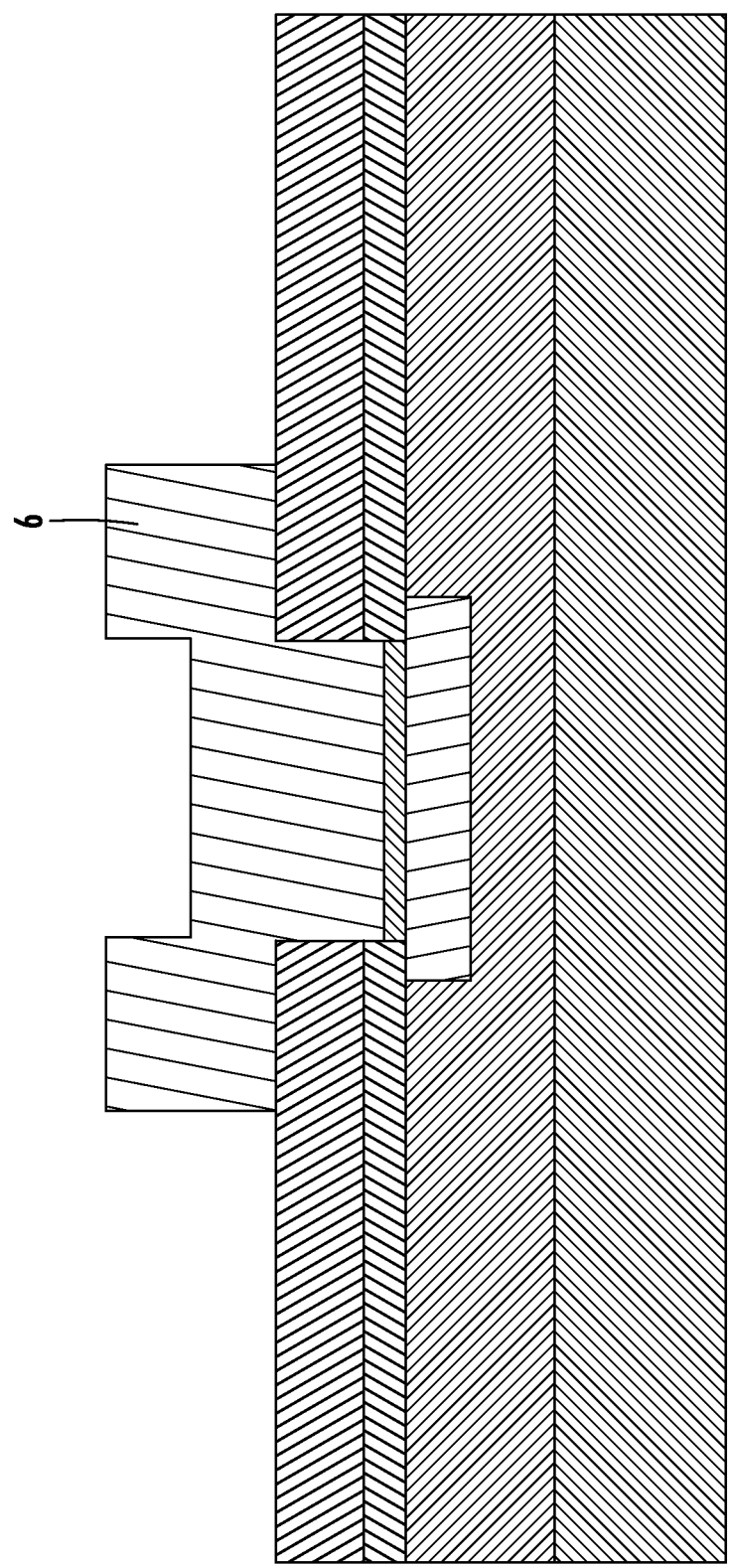

As shown in FIG. 3B, in a process of forming a photodetector of an embodiment, such as a PIN photodiode, regions in the insulating layer (passivation film) 4 can be subsequently etched to form diode junction windows. A pattern of windows can be defined using standard photolithographic processes. For example, a patterned photoresist can be formed using a mask designed for the specific application. With the pattern of windows formed into the dielectric film photolithographically, local doping such as doping a P+ species in the active layer 2 using a metal with less valence electrons than the group III atoms, such as Zinc, Beryllium, or Cadmium can be performed to form P+ region 5. The P+ region 5 formation can be achieved by employing thermal diffusion processes or ion implantation.

It is noted that a method for forming a pixel PIN photodiodes is not necessarily defined by the "planar" processes as described above. In an alternative embodiment, a "MESA" etch process can be employed in material systems where there is no benefit to avoiding sidewall junction exposure. Accordingly, the method described above can be used when higher bandgap materials are employed to minimize surface leakage currents from exposing pn junctions. Where a homojunction is utilized, or for reasons of cost, performance, or otherwise, an epitaxially grown-in junction may be desirable. In such an embodiment, the process of patterning and forming localized P+ regions, or pixels, is replaced by including P+ layers in the epitaxial structure, and as such the continuous P+ film must be patterned and etched of suffient depth to as to break electrical communication of one P+ region pixel to another. Thus leaving pixel "mesas". It is also known in the art to utilize common P-type semiconductor, with localized N-type pixels, following similar processes described in these embodiments. The common nomenclature used to describe the two polarities are "common cathode" or "common anode", where the common node denotes the anion or cation type of the bulk semiconductor. The pixel, then would be defined by forming localized regions of opposite type—thus forming pn-junction boundary layers around each pixel, which is the basis of diode functionality. Accordingly, such an alternative process of discrete diode formation includes the step of etching through the pn junction to form mesa pixels and can be utilized with material systems such as HgCdTe, InSb, and the like.

Metallization

After the diode junctions are formed between the P+ region 5 and active layer 2, the photodiode fabrication process can be completed by subsequent metallization etch processes utilizing a process selection of either photolithographic lift-off or damascene etch-back processes to form metal contacts 6. These additive or subtractive methods of forming a metal contact 6 on semiconductor wafers is common to those skilled in the art of forming patterned P+ or N+ metal contacts. For example, in an embodiment, a P+ contact metal can be selected based on adhesion, barrier, and top metal, commonly comprised of one or a stack of select metals chosen from the following: Tl, Cr, Ni, Pd, Pt, Au, AuZn, Cu, Al, and the like. On the other hand, N+ contact metals can be selected for achieving low contact resistance, or "ohmic" conditions. For example, N contacts can include, but are not limited to: AuGe, Cr, Ni, Ti, PtAu, Cu, TiW, and the like.

Figure 3D:
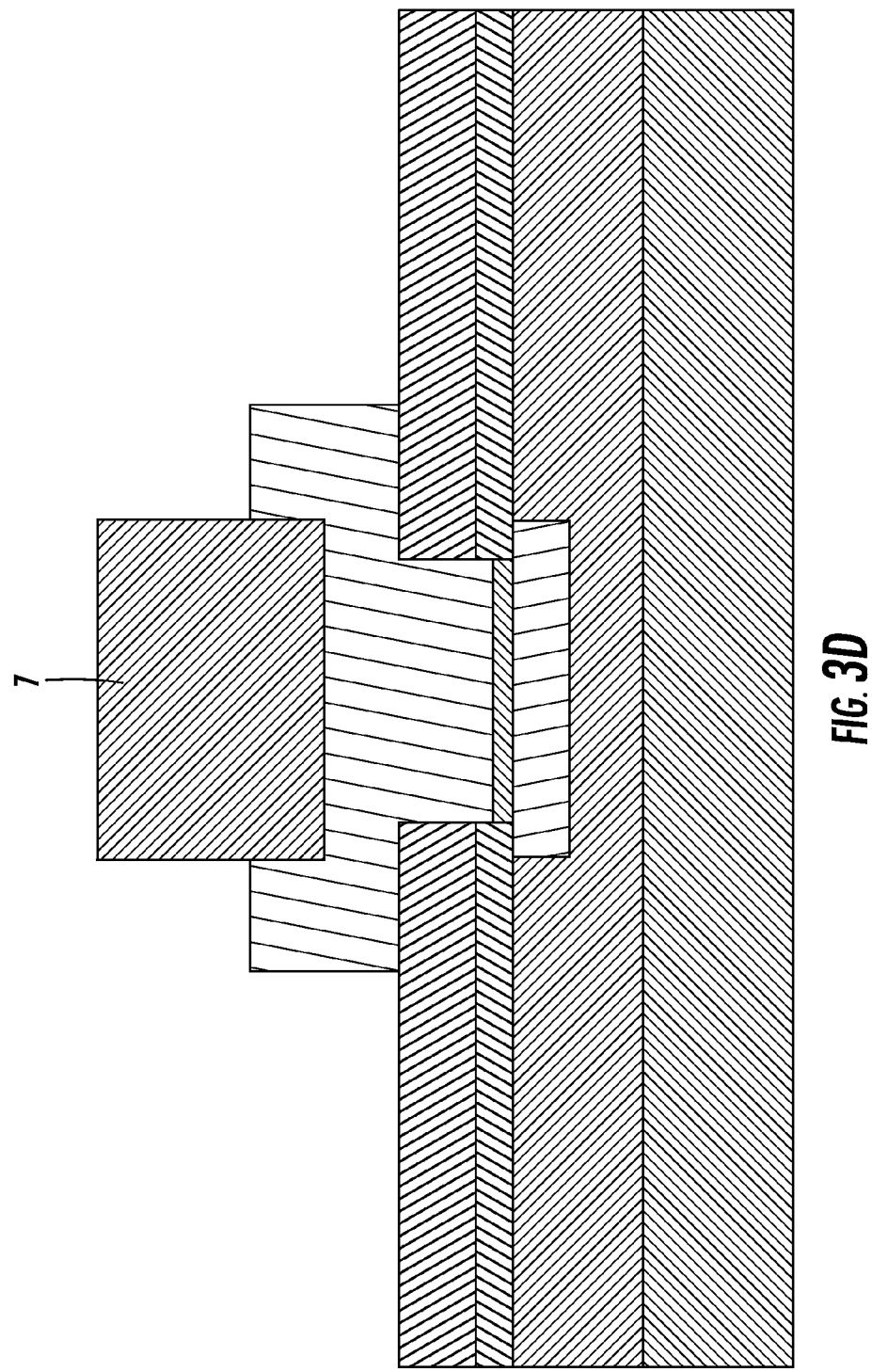

Finally, a bump (interconnect) 7 formed of indium for example can be formed on the contact metal 6 as shown in FIG. 3D. Other appropriate metals can be selected for the interconnect 7.

Photodiode Array (PDA)

In an embodiment, a 2D Focal Plane Array (FPA) is formed. The FPA can include a two-dimensional pixel grid formed of a plurality of pixel photodetector, such as the pixel photodetector shown in FIG. 3D, formed on a shared substrate, and can be used for a wide range of image resolution and pixel pitch. Though fabrication processes are not limited to these resolutions, in an example, an infrared focal plane array (IRFPA) image sensor can have a resolution or 320×240 to a resolution of 1280×1024, and of pixel pitch 10 um to 40 um. Accordingly, as shown in FIGS. 4A-4E, embodiments described herein and include an array of pixel photodiode photodetectors 8 which can be integrated for use in a focal plane array. As discussed above, the array of photodiodes can be formed on a common wafer 1 that includes a substrate 3, active layer 2 and insulating layer 4.

Hybridization to ROIC

Figure 4A:
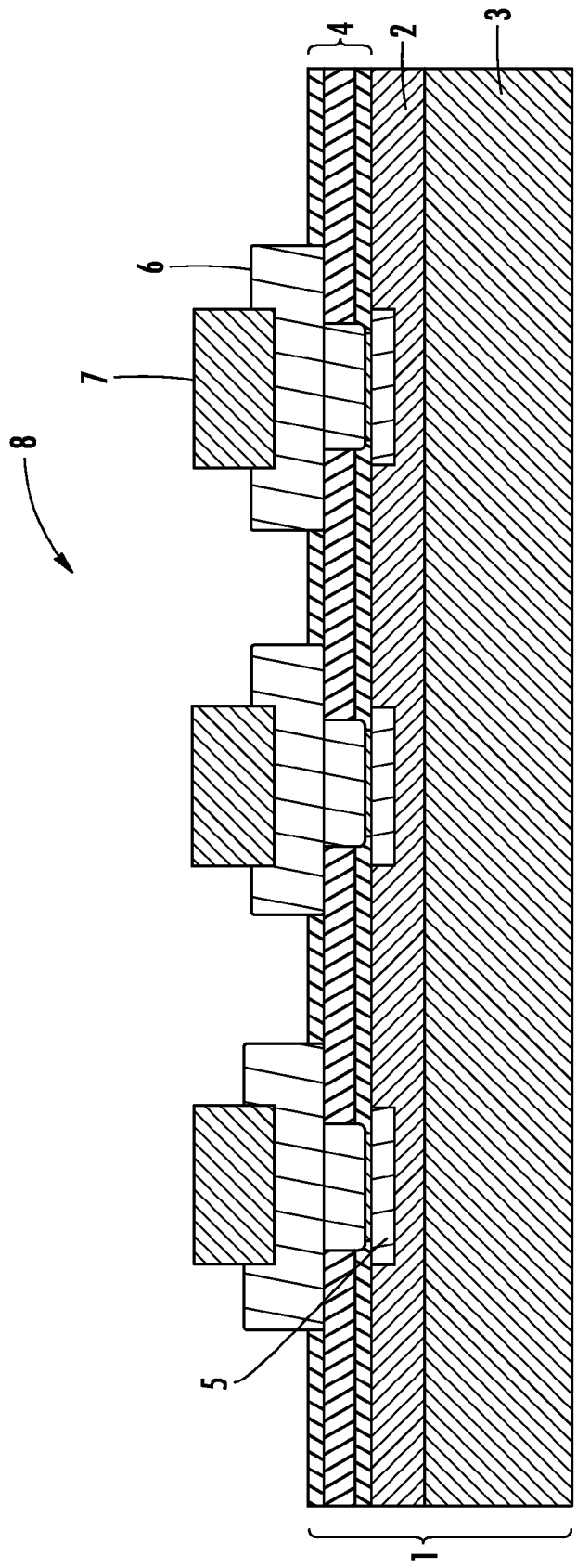
FIGS. 4A-4E illustrate stages of manufacture in a process of making a focal plane array according to an embodiment.

Hybrid FPAs employed in IRFPA assemblies, where the photo sensor is formed in an external medium to that of the readout circuitry, can be interfaced with the readout electronics GaSb, InAs, InSb, GaAs bump-technology. The flip-chip techniques employed for image-sensors commonly use indium-bumps deposited or plated directly to the diode contacts 6, such as interconnects 7 as shown in FIG. 4A.

Figure 4B:
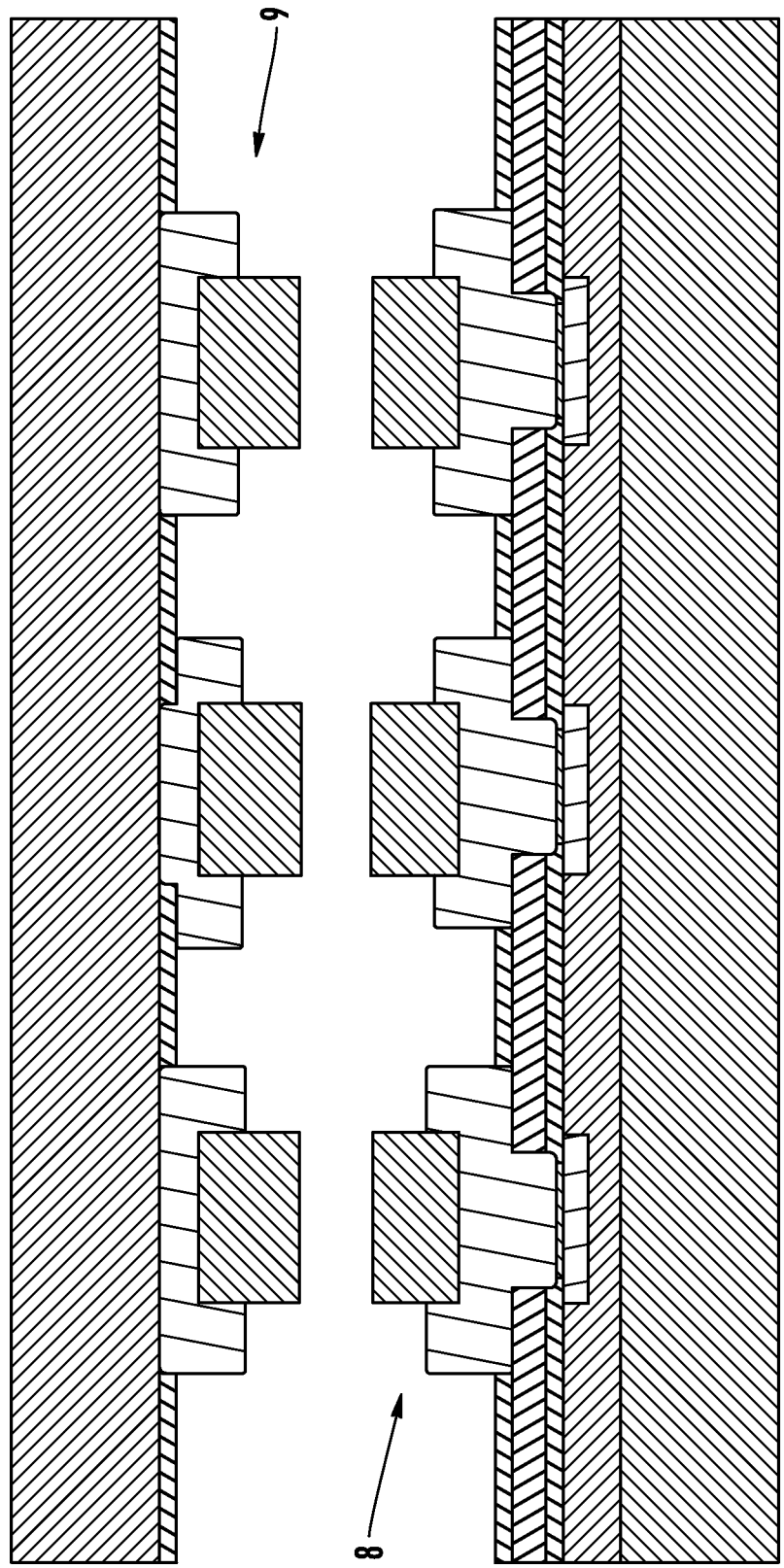
Figure 4C:
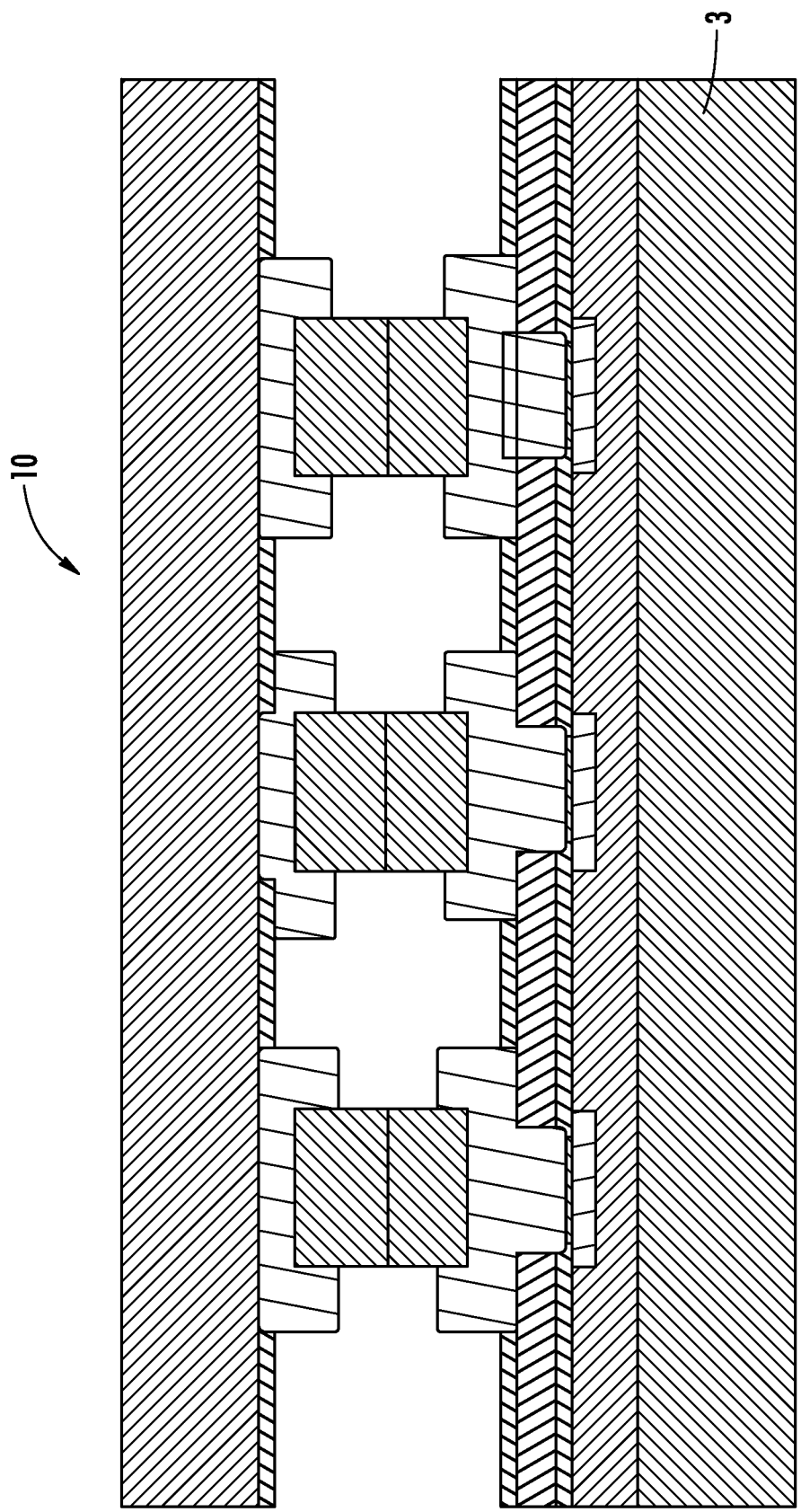

As shown in FIG. 4B, corresponding mating bump arrays can be deposited over the readout IC (ROIC) 9 pixel pads to form corresponding electrodes for photodiodes of the photodiode array 8. When joined and placed in electrical communication with the photodiode array 8 as shown in FIG. 4C, the ROIC 9 can be configured, therefore, as a charge sensing or charge integration device, thus converting photocurrents produced when appropriate energy light reaches the active layer 2 of a photodiode into voltages, and multiplexes the photocurrents for use in image analytics or video display.

Interconnect technology for IRFPAs commonly use indium for its high ductility and ability to withstand large thermal swings without imparting strain due to CTE mismatch of the detector material to the ROIC silicon. However, it will also be understood by those skilled in the art, that other metal schemes or interconnect technology can be utilized. For example, such other interconnects can include Cu and Cu alloys, insertion methods utilizing various microtip formations, pillars, microtubes, or direct waferbond contacts.

Figure 4D:
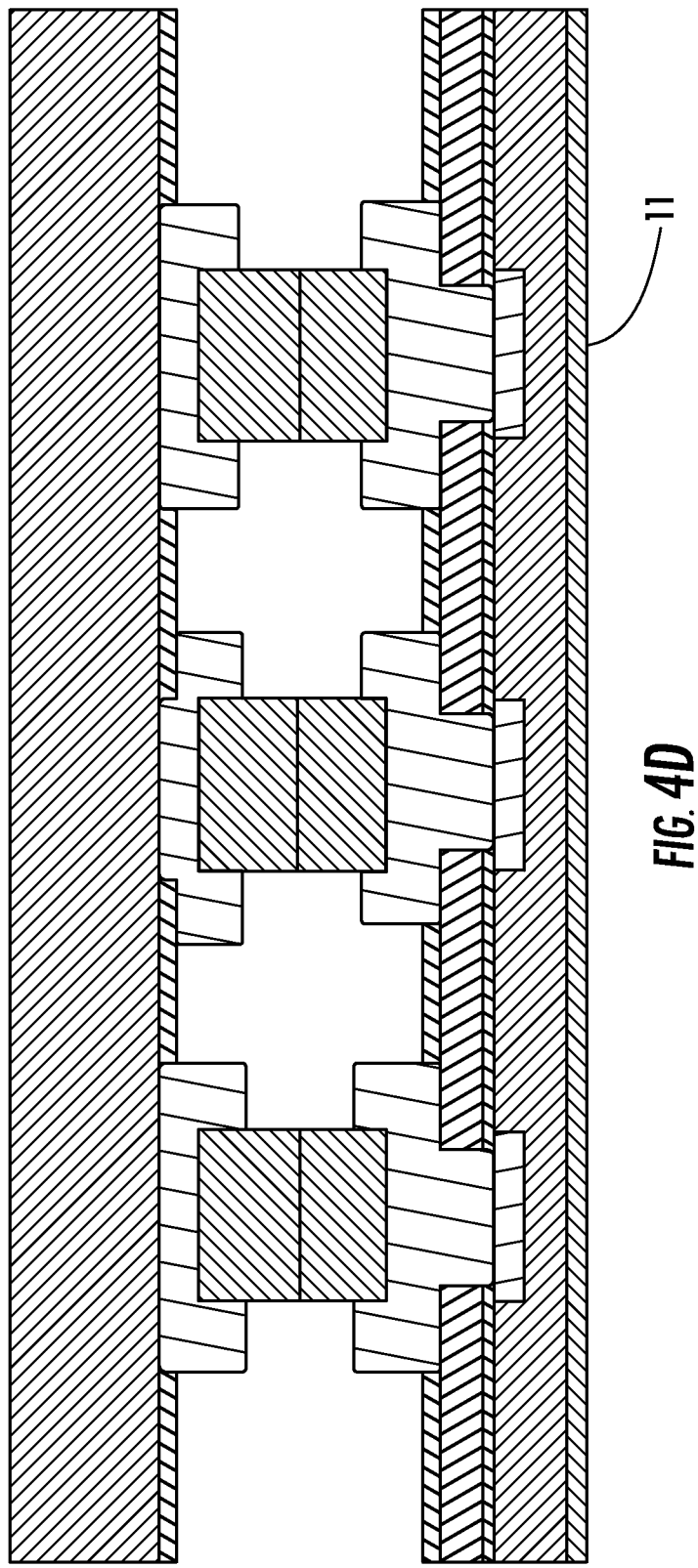
Figure 4E:
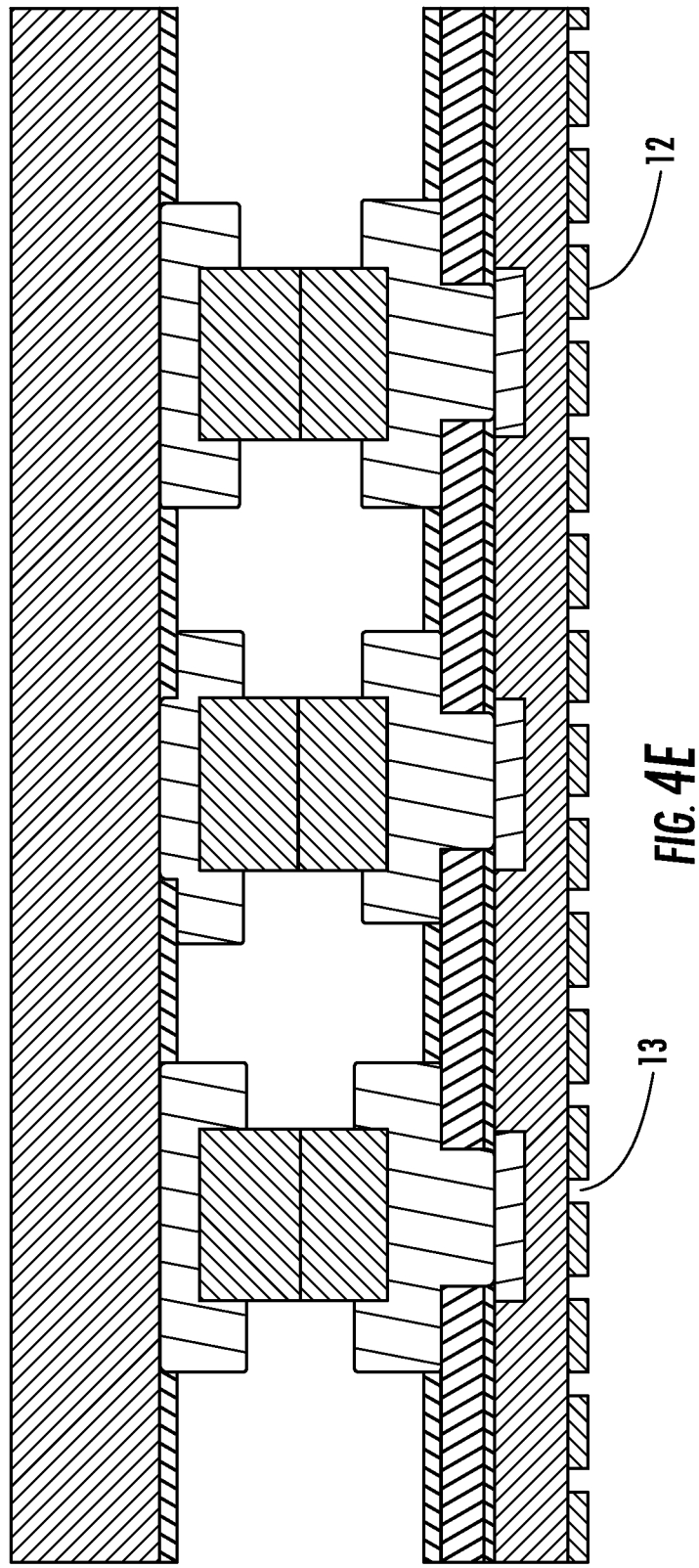

The compound semiconductor substrate layer 3 can be about 500-650 μm and can include more than one layer, such as layers of InP, GaAs, InSb, InAs, GaSb. Such material layers can be thinned, such as shown in FIG. 4D, by employing an etch stop process or other chemo-mechanical or purely mechanical bulk removal process to form thinned blocking layer 11. The remaining material forming thinned blocking layer 11 must be thin enough to allow for via formation suitable to transmit photons in the wavelength of interest. Vias, such as blind vias 13, can be patterned into thinned blocking layer 11 to form a patterned/perforated blocking layer 12 as shown in FIG. 4E.

As discussed above, the thickness of patterned/perforated blocking layer 12 remains substantially that of thinned blocking layer 11 such that it can transmit radiation having a first wavelength, while blocking radiation having a second wavelength that is lower than the first wavelength. The blind vias 13 can be etched into the remaining substrate thickness, or remaining buffer after etch stop layer removal, for example thinned blocking layer 11. The blind vias 13 can be patterned to have a diameter sufficient to allow higher energy photons from the radiation having a second wavelength, such as visible light, to pass through the vias and reach the active layer. Accordingly, the blind vias 13 can be formed to have a diameter that is on the order of the wavelength of visible light, or larger and can include a diameter of about 0.1 μm to about 1 μm, and a diameter of about 0.5 μm to about 1 μm.

The patterned/perforated layer 12 can be passivated (not shown) in order to minimize or eliminate defects or surface states in the exposed low-bandgap material that could contribute to noise of the detector. Accordingly, although small via diameter will enable electric field from the cladding layer to promote adequate surface accumulation, a back-side passivation process can be employed.

Figure 5:
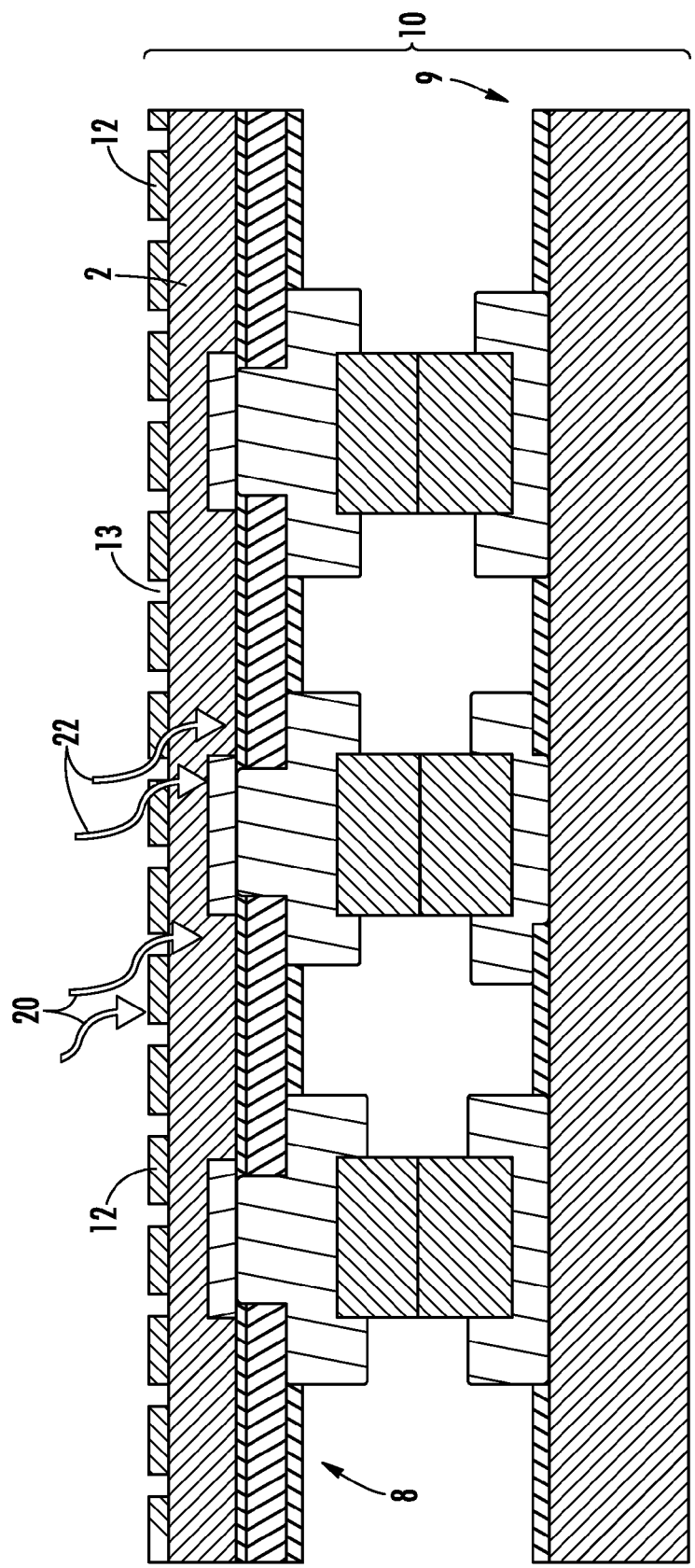
FIG. 5 illustrates an embodiment of a focal plane array during operation.

As shown in FIG. 5, a hybridized focal plane array 10 can include a photodiode array 8 in which the photodiodes thereof are in electrical communication with an electrical contact of an ROIC 9. The photodiode array can include a thinned down and patterned InP substrate that forms a patterned/perforated blocking layer 12 that includes a pattern of blind vias 13. The photodiode array can also include an InGaAs active layer 2. The back-side of the photodiode array can be exposed to a radiation source, and the perforated/patterned blocking layer 12 can serve as an incident surface for the incoming photon flux from a radiation 22 having a first wavelength and radiation 20 having a second wavelength that is smaller than the first wavelength. In some embodiments, anti-reflective (AR) coatings (not shown) can be formed on the patterned/perforated blocking layer 12. For example, PECVD Silicon Nitride can be formed as an appropriate single-layer AR film for visible and SWIR light in the wavelength range of about 500 nm to about 1700 nm. Those of skill in the art will recognize that other processes for forming multi-layer stacks are common in the industry. Additional treatments, such as wet-etches or in-situ surface treatment can be further employed to minimize surface states from bound oxide or other charged ions.

In an embodiment utilizing an InGaAs active layer, lattice matched to an InP substrate: Without thinning the substrate, a photo response is limited to radiation having a wavelength higher than about 1.1 µm. Meanwhile the active layer, which can be a lattice matched InGaAs layer can be photoresponsive to radiation having a wavelength of about 1.7 µm. By thinning the substrate to a thickness of about 0.5 µm to about 2 µm, a backing layer can be formed with sufficient transmission to achieve a visible response in the device with radiation having a wavelength as low as about 450 nm (blue light). However, the thickness of the substrate during a thinning process must be carefully controlled as small variations can result in dramatic changes to the low-end wavelength detection range. For example, because InP has an absorption coefficient such that it can serve as a long-pass filter, a backing layer having a thickness of greater than about 2 µm can result in sufficient visible response being cut off so as to limit usefulness for visible-light imaging. As such, not only is the nominal target thickness important, but under an embodiment not utilizing a perforated layer such as is described in this invention, any thickness variation of the blocking layer will have substantial impact upon the short-wavelength response uniformity.

By perforating the thin InP layer to form the perforated/patterned backing layer 12, for example, photo response to a wavelength of 450 nm is achievable in more consistent manner. Accordingly, such patterning enabled the thickness variation in the InP layer to be de-coupled from the photo response turn-on. In other words, by patterning the InP backing layer, a desired thicker layer which provides electrical and mechanical benefits as discussed above, can be varied without degrading device performance.

For example, conventional Visible-SWIR or NIRSWIR devices offer 10-15% response at 450 nm, 30-50% to 600 nm, rising to 50-80% once above 1100 nm. While not limited to a particular theory, it is believed that a device comprising the hybridized focal plane array of embodiments described herein invention can boost 450 nm response to 30-50%, and flatten response over the 600 nm-1100 nm range, offering improved visible response performance.

In an example, the benefit of enhanced visible response for SWIR imaging products comprising embodiments described herein can be realized in applications such as Driver Vision Enhancement, or man-portable systems such as industrial or soldier-mount systems. For example, a stronger visible response provided by embodiments described herein, can provide imagery that is more intuitive, gaining benefit of SWIR without losing situational awareness from visible cues from commonly used pigments.

While the invention has been illustrated with respect to one or more implementations, alterations and/or modifications can be made to the illustrated examples without departing from the spirit and scope of the appended claims. In addition, while a particular feature of the invention may have been disclosed with respect to only one of several implementations, such feature may be combined with one or more other features of the other implementations as may be desired and advantageous for any given or particular function.

For example, in some embodiments, etch stop layers can be employed to ensure adequate thickness of the remaining buffer/cladding layer. Such a feature enables robust design, which is less vulnerable to defects due to etch pits, fracture, or other causes. Thicker cladding layers made possible by inclusion of an etch stop layer to prevent over-thinning can also improve current-resistance performance for charge uniformity over larger devices.

In some embodiments etch-stop layers may not be employed. Accordingly, chemo-mechanical or purely mechanical process can be used for thinning the substrate to form a thinned backing layer. A patterned/perforated backing layer configuration with an array of blind vias formed therethrough allows for thicker stop-thickness specifications. This can be followed by careful control of dry-etch techniques to form the blind-vias to appropriate depth to achieve the desired result.

Additionally, some embodiments described herein are described without limitation as to a particular pattern or configuration of the array of vias. In some embodiments, the blind vias are of a sufficiently smaller diameter than the pixel grid pitch. Accordingly, such configurations include a plurality of vias per unit cell, such that photo response is uniformly distributed and no fixed-pattern response variation is observed. Such a distribution of vias can be provided as to make alignment a non-critical feature for achieve the desired response. In embodiments comprising planar (monolithic) structures, for which the diffused or implanted junction allows for a continuous volume of active area between pixels, such a feature will be even less critical. In embodiments comprising shallow-trench mesa pixels, for which the mesa is only deep enough so as to isolate individual pixels, the alignment of vias becomes more important.

Meanwhile, in embodiments comprising deep-trench mesa devices for which the active area is completely removed between individual pixels, the via must be centered within the optical path for each pixel. Accordingly, to achieve best advantage and highest sensitivity using this approach, preferred embodiments such as those provided in FIGS. 2-5 comprise planar (monolithic) structures, which provide for better utilization of minority carrier diffusion.

In some embodiments, for example those comprising video-rate imaging or sub MHz duty cycle, experimental collection efficiency for carriers has generated between pixels can be 100%. Accordingly, in preferred embodiments, the alignment of the blind-vias is not critical to achieve high efficiency of the generated photocarriers from the high energy photons passing through the via. It is noted that an added benefit of such an alignment-agnostic feature provides embodiments suitable for die-level operations or wafer-scale operations. This provides a process engineer the option, depending upon process capability, to employ embodiments described herein at various stages of process maturity. That is, embodiments described herein can lend themselves to wafer-scale operations, such that die to wafer bonding enables processing post hybridization, thereby making the photolithography and etch operations required for via formation consistent with typical manufacturing operations, using the same tooling as existing methodology. Accordingly, the blind vias of the embodiments can be formed using techniques known in the art such as wet-etch, reactive ion etching, ICP, and the like, including the use of any etch mask that is standard to the corresponding process, such as photoresist or other patterned material.

Further embodiments described herein can include blind vias having predetermined depths. In some embodiments, it is advantageous to stop the blind-via at the interface between the cladding (blocking) layer and the active layer such as shown in FIG. 5. In some embodiments, it is desirable to form vias, which penetrate into the active layer. It is noted that deeper vias can increase problems associated with surface recombination and charge trapping. However, in embodiments for which adequate passivation of surface states is provided, higher energy photons can be delivered nearer the diode depletion zone than previously possible in conventional devices. Thus, for active materials such as silicon in which minority carrier lifetime is short, or applications where frame-to-frame charge latency is problematic, delivering photocarriers closer to the collection area may improve temporal response, thus improving spatial and temporal resolution.

While not limited to a particular theory, it is believed that etching to form the plurality of vias could impact spatial distribution of electric field. Accordingly, in embodiments, a specific pattern of via distribution may form a 'lensing' or directional focus for charge, thus carriers can become focused as determined by the spatial distribution of the vias, and the bias applied to the cladding layer. This can also lead to improved MTF (modulation transfer function). In such an embodiment, the alignment can be critical. Thus, wafer-scale operations may be much desired to that of die-level patterning.

In embodiments, wafer processing typically includes substrate thinning and polishing, sufficient to achieve acceptable total thickness variation (TTV) and surface roughness. In embodiments, wafer level thinning operations can be implemented prior to hybridization. Thin wafer handling methods, such as those utilized in advanced 3D-IC applications can be utilized for prethinning substrate-removed focal plane array prior to hybridization. In embodiments, complete substrate removal can be conducted after hybridization by employing individual device handling measures for such critical thinning operations.

Additionally, some embodiments propose specific application to compound semiconductors because of the intrinsic back-illuminated hybrid composition. However, it is believed that embodiments described herein can employ back Illuminated silicon imagers in order to provide local regions of thinner bulk where desired.

Furthermore, to the extent that the terms "including", "includes", "having", "has", "with", or variants thereof are used in either the detailed description and the claims, such terms are intended to be inclusive in a manner similar to the term "comprising." As used herein, the phrase "one or more of", for example, A, B, and C means any of the following: either A, B, or C alone; or combinations of two, such as A and B, B and C, and A and C; or combinations of three A, B and C.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A focal plane array comprising:
an array of photodetectors, each photodetector in electrical communication with a corresponding one of an electrode of a read out integrated circuit, wherein the array of photodetectors comprises:
an insulating layer;
a blocking layer comprising at least one blind via; and
an active layer formed between the insulating layer and the blocking layer,
wherein a material of the blocking layer transmits radiation having a first wavelength and reflects radiation having second wavelength that is lower than that of the first wavelength, and
wherein a diameter of the at least one blind via is selected to allow radiation of the second wavelength to pass through the at least one blind via.

2. The focal plane array of claim 1, wherein the material of the blocking layer transmits infrared radiation and reflects visible radiation, and wherein the diameter of the at least one blind via is selected to allow visible radiation to pass through the at least one blind via.

3. The focal plane array of claim 1, wherein the at least one blind via comprises an array of blind vias.

4. The focal plane array of claim 1, wherein the diameter of the at least one blind via is about 0.1 µm to about 1 µm.

5. The focal plane array of claim 1, wherein the at least one blind via extends from a surface of the blocking layer to an interface of the blocking layer and the active layer.

6. The focal plane array of claim 1, wherein the at least one blind via extends from a surface of the blocking layer and penetrates into the active layer.

7. The focal plane array of claim 1, further comprising an etch-stop layer formed between the blocking layer and the active layer.

8. The focal plane array of claim 1, wherein the blocking layer comprises InP, GaAs, InSb, InAs, or GaSb.

9. The focal plane array of claim 1, wherein the active layer comprises at least one layer selected from the group comprising of InP, InGaAs, InAsP, or InGaAsP.

10. A photodetector, comprising:
an insulating layer;
a blocking layer comprising at least one blind via; and
an active layer formed between the insulating layer and the blocking layer,
wherein a material of the blocking layer transmits radiation having a first wavelength and reflects radiation having second wavelength that is lower than that of the first wavelength, and
wherein a diameter of the at least one blind via is selected to allow radiation of the second wavelength to pass through the at least one blind via.

11. A method of forming a focal plane array, comprising:
forming an array of photodetectors, wherein the array of photodetectors comprises:
an insulating layer,
a blocking layer comprising a material that transmits radiation having a first wavelength and reflects radiation having second wavelength that is lower than that of the first wavelength, and
an active layer formed between the insulating layer and the blocking layer;
electrically bonding the array of photodetectors to a read out integrated circuit, wherein each of the photodetectors is placed in electrical communication with a corresponding one of an electrode of the read out integrated circuit; and
forming at least one blind via in the blocking layer of the array of photodetectors, wherein a diameter of the at least one blind via is selected to allow radiation of the second wavelength to pass through the at least one blind via.

12. The method of claim 11, wherein forming the at least one blind via comprises etching the blocking layer.

13. The method of claim 11, further comprising forming the active layer on a substrate and thinning the substrate to form the blocking layer.

14. The method of claim 11, wherein the material of the blocking layer transmits infrared radiation and reflects visible radiation, and wherein the diameter of the at least one blind via is selected to allow visible radiation to pass through the at least one blind via.

15. The method of claim 11, wherein the at least one blind via comprises an array of blind vias.

16. The method of claim 11, wherein the diameter of the at least one blind via is about 0.1 µm to about 1 µm.

17. The method of claim 11, wherein the at least one blind via extends from a surface of the blocking layer to an interface of the blocking layer and the active layer.

18. The method of claim 11, wherein the at least one blind via extends from a surface of the blocking layer and penetrates into the active layer.

19. The method of claim 11, further comprising forming an etch-stop layer between the blocking layer and the active layer.

20. The method of claim 11, wherein the blocking layer comprises InP, GaAs, InSb, InAs, or GaSb and wherein the active layer comprises at least one layer selected from the group comprising of InP, InGaAs, InAsP, or InGaAsP.

* * * * *